(12) United States Patent
Imai (10) Patent No.: US 7,370,895 B2
(45) Date of Patent: May 13, 2008

(54) WORK TRANSFER DEVICE AND METHOD OF TRANSFERRING WORK

(75) Inventor: Shinobu Imai, Mitaka (JP)

(73) Assignee: Tokyo Seimitsu Co., Ltd., Mitaka-shi, Tokyo (JP)

( * ) Notice: Subject to any disclaimer, the term of this patent is extended or adjusted under 35 U.S.C. 154(b) by 0 days.

(21) Appl. No.: 11/565,191

(22) Filed: Nov. 30, 2006

(65) Prior Publication Data
US 2007/0128015 A1 Jun. 7, 2007

(30) Foreign Application Priority Data
Dec. 5, 2005 (JP) .............................. 2005-350740

(51) Int. Cl.
*B25J 15/06* (2006.01)
(52) U.S. Cl. .......................... 294/2; 294/64.1; 294/65; 294/907; 414/752.1
(58) Field of Classification Search .................. 294/2, 294/64.1, 64.2, 64.3, 65, 907; 414/627, 730, 414/737, 752.1, 941; 901/40, 46
See application file for complete search history.

(56) References Cited

U.S. PATENT DOCUMENTS 2,783,078 A * 2/1957 Billner ......................... 294/65
4,473,247 A * 9/1984 Itemadani et al. .............. 294/2
4,858,974 A * 8/1989 Stannek .......................... 294/2
5,024,575 A * 6/1991 Anderson .................... 414/627
5,752,729 A * 5/1998 Crozier et al. .................. 294/2
6,152,507 A * 11/2000 Pirker ....................... 294/64.3

FOREIGN PATENT DOCUMENTS

JP        7169716 A        7/1995

* cited by examiner

*Primary Examiner*—Dean J Kramer
(74) *Attorney, Agent, or Firm*—David S. Safran (57) ABSTRACT

Provided are a work transfer device and a method of transferring work which are capable of safely transferring work without letting the work to fall even when poor adhesion of a frame occurs due to troubles. By providing an adsorption part which adsorbs a frame, and a plurality of frame clamps which move to near a bottom surface of the frame when the frame has been adsorbed and transferred by the adsorption part, and which retract from near the bottom surface of the frame when the transfer of the frame has been finished and the adsorption of the frame has been finished.

2 Claims, 8 Drawing Sheets

FRAME CHUCK IN OPEN CONDITION

FIG.3B

FRAME CHUCK IN CLOSED CONDITION

WORK TRANSFER DEVICE AND METHOD OF TRANSFERRING WORK

BACKGROUND OF THE INVENTION

1. Field of the Invention

The present invention relates to a work transfer device which transfers work, such as semiconductor devices and electronic parts, and a method of transferring work.

2. Description of the Related Art

Figure 7:
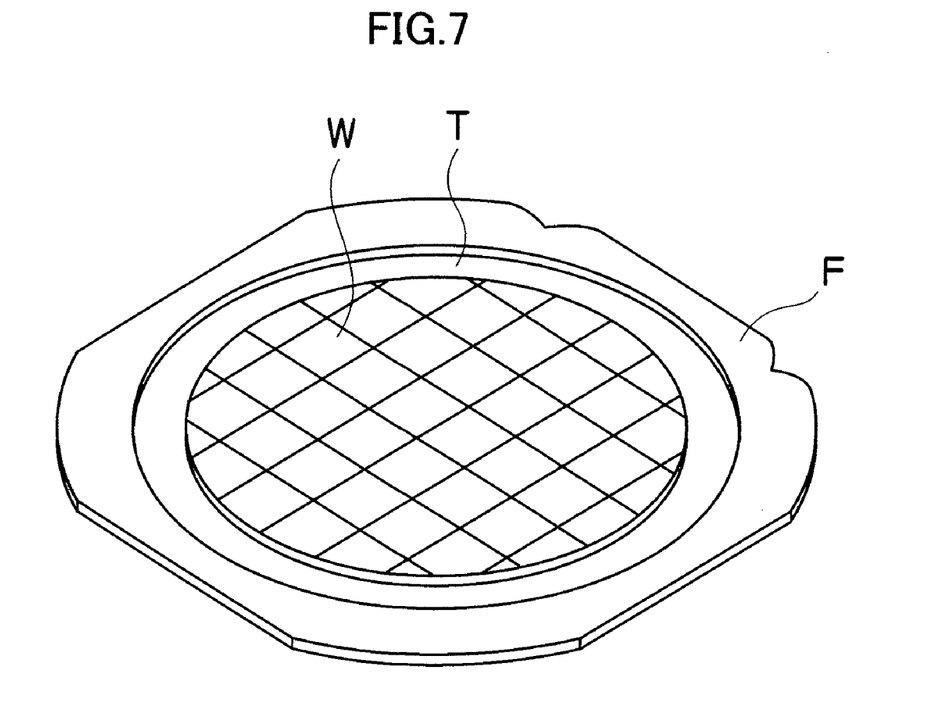
FIG. 7 is a perspective view of work mounted on a frame.

The rear surface of work which is a plate-work object on the surface of which a semiconductor device, an electronic part and the like are formed, is as shown in FIG. 7 stuck on a dicing tape T having an adhesive material on the top surface thereof. The work W stuck on the dicing tape T is mounted on a frame F via the dicing tape T. The work W mounted on the frame F is transferred in this state within a dicing machine or a die bonding machine or between these machines and the like, and various kinds of working are performed by each of the machines. In transferring the work W, it is general practice to perform the transfer by vacuum adsorbing the frame F (refer to Japanese Patent Application Laid-Open No. 7-169716, for example).

Figure 8A:
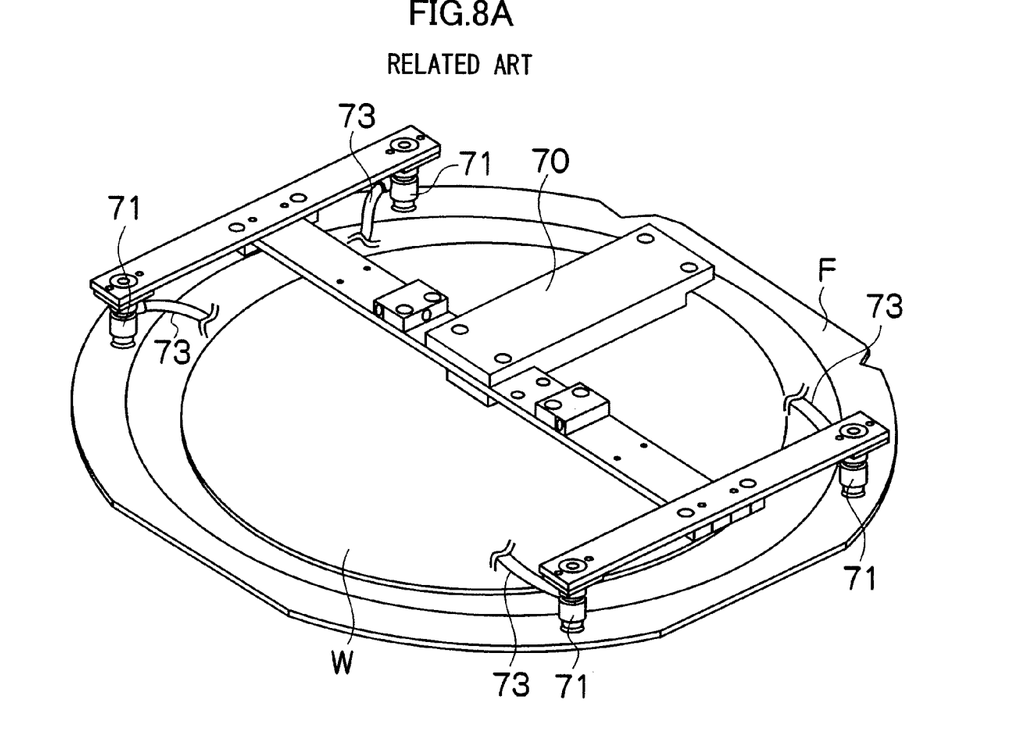
FIGS. 8A and 8B are perspective views which show a conventional frame holding mechanism.
Figure 8B:
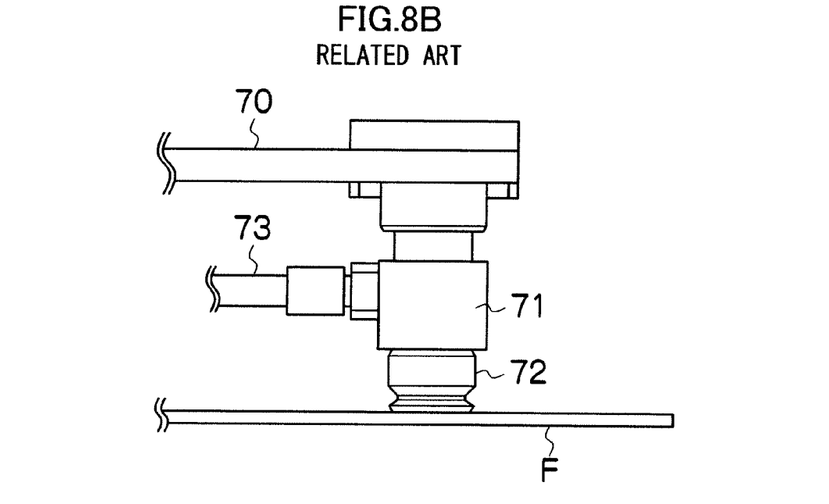

Conventionally, a work transfer device which transfers a frame F on which work W is mounted is provided with a transfer arm shown in FIG. 8A. In the transfer arm, a plurality of adsorption parts 71 in a transfer arm body 70 connected to a transfer mechanism not shown in the figure. As shown in FIG. 8B, a pad 72 is provided at a leading end of the adsorption part 71 and a tube 73 is connected to the adsorption part 71. The tube 73 is connected to a source of vacuum generation, which is not shown, and by operating the source of vacuum generation, the adsorption part 71 adsorbs the frame F by the pad 72 and transfers the frame F.

SUMMARY OF THE INVENTION

As described above, in a conventionally used work transfer device, a source of vacuum generation is operated by using electrical power, air and the like as a driving source. However, in such adsorption methods, there are cases where it becomes impossible to maintain a vacuum state during a power failure or due to troubles in valves connected in intermediate portions and the like, and there is a danger that work is let to fall along with the frame and be broken.

The present invention has been made to solve such problems and has as its object the provision of a work transfer device and a method of transferring work which can safely transfer work without letting work to fall even when poor adhesion due to troubles occurs.

To achieve the above object, a first aspect of the present invention is characterized in that a work transfer device comprises: an adsorption part which adsorbs a frame on which work is mounted; and a plurality of frame clamps which move to near a bottom surface of the frame when the frame has been adsorbed and transferred by the adsorption part and which retract from near the bottom surface of the frame when the transfer of the frame has been finished and the adsorption of the frame has been finished.

According to the first aspect, in adsorbing and transferring the frame by the adsorption part provided in the work transfer device, the plurality of frame clamps move to near the lower portion of the frame. The frame clamps are present near the lower portion of the frame until work is placed in a target place and the transfer is completed.

As a result of this, in a case where the adsorption of the frame becomes impossible during work transfer because of a power failure or due to troubles in valves and the like, the frame released from the adsorption is received by the frame clamps present in the lower portion of the frame and the work does not fall. Therefore, it is possible to safely perform the transfer of the work.

The frame clamps are present near the lower portion of the frame and are not in contact with the frame during transfer. Therefore, the frame clamps do not hinder the adsorption of the frame by the adsorption part.

A second aspect of the present invention is characterized in that in the first aspect, the frame clamps move to near the bottom surface of the frame after the adsorption part has adsorbed the frame and maintain positions thereof after the movement until a driving source which moves the frame clamps is newly supplied to the frame clamps.

According to the second aspect, the frame clamps move to near the lower portion of the frame after it is ascertained that the adsorption part has adsorbed the frame. After the movement, the frame clamps maintain positions thereof after the movement until a driving source of air and the like, which is necessary for the movement of the frame clamps, is newly supplied.

As a result of this, the frame clamps do not hinder the adsorption of the frame by the adsorption part. Even when the adsorption of the frame does not work any more during transfer because of a power failure or due to troubles in valves and the like, the frame clamps do not move until a driving source of air and the like for moving the frame clamps is newly supplied. Therefore, the frame clamps do not let the work to fall.

A third aspect of the present invention is characterized in that in a work transfer device which adsorbs a frame on which work is mounted by use of an adsorption part and transfers the work, the frame which falls due to poor adsorption is received by frame clamps which move to near a bottom surface of the frame after the adsorption part has adsorbed the frame and maintain positions thereof until a driving source for movement is newly supplied.

According to the third aspect, in adsorbing and transferring the frame by use of the adsorption part provided in the work transfer device, the plurality of frame clamps move to near the lower portion of the frame and the frame clamps maintain positions thereof until a driving source of air and the like is newly supplied.

As a result of this, even when the adsorption of the frame does not work any more during work transfer because of a power failure or due to troubles in valves and the like and the frame falls, the frame is received by the frame clamps and hence the fall of the frame is prevented.

As described above, according to a work transfer device and a method of transferring work of the present invention, even when the adsorption of the frame does not work any more because of a power failure or due to troubles in parts and the like, it becomes possible to safely transfer work without letting the work to fall.

DETAILED DESCRIPTION OF THE PREFERRED EMBODIMENTS

Preferred embodiments of a work transfer device and a method of transferring work of the present invention will be described in detail with reference to the accompanying drawings.

Figure 1:
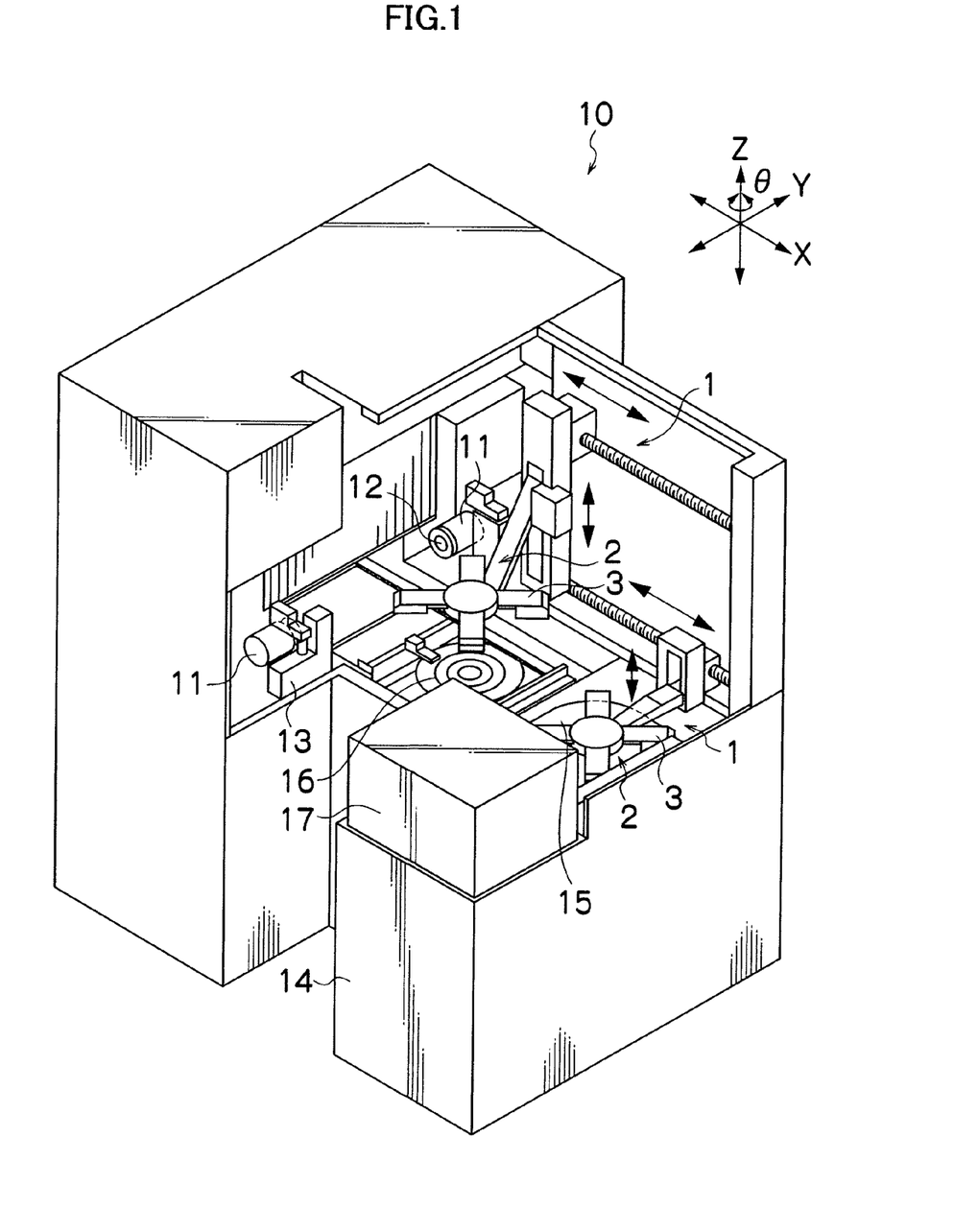
FIG. 1 is a perspective view of a dicing machine on which a work transfer device related to the present invention is mounted.

First, a description will be given of the construction of a wafer polishing machine in which a work transfer device related to the present invention is incorporated. FIG. 1 is a general perspective view of the wafer polishing machine.

A dicing machine 10 is equipped with high-frequency motor incorporated spindles 11, 11 which are disposed opposed to each other in order to perform the working of work, and to a leading end of which a blade 12 and an unillustrated wheel cover are attached, a microscope 13 attached near the spindle 11 to observe the work, and a worktable 16 which adsorbs and holds the work.

In addition, the dicing machine 10 is equipped with work transfer devices 1, 1 which perform the transfer of work, a spinner 15 which performs the spin cleaning of worked work W, an elevator 14 as a load port on which a cassette 17 housing multiple pieces of work mounted on a frame is placed.

The blade 12 is rotated by the spindle 11 at high speeds of 20,000 rpm to 100,000 rpm and moves along with the spindle 11 in the Y- and Z-directions by an unillustrated moving shaft.

The worktable 16 adsorbs and holds the work W, reciprocates in the X-direction by an unillustrated moving shaft and rotates in the θ-direction.

A frame holding mechanism 2 covered with a cover 3 is provided at the leading end of the work transfer device 1, and the work transfer device 1 performs the transfer of work W by adsorbing the frame on which the work is mounted by use of the frame holding mechanism 2. One of the work transfer devices 1, 1 performs the transfer of work W free from dirt before working and after cleaning, and the other performs the transfer of the work W after working to which dirt adheres.

Work W mounted on the frame F as shown in FIG. 7 is supplied from the cassette 17 to the dicing machine 10 and transferred by one work transfer device 1 onto the worktable 16, where the work W is adsorbed and held. The adsorbed and held work W is lengthwise and crosswise cut by the blade 12 which is rotating at high speeds.

The work W after cutting is transferred by the other work transfer device 1 to the spinner 15, where the work W is spin cleaned and returned again to the cassette 17.

Figure 2:
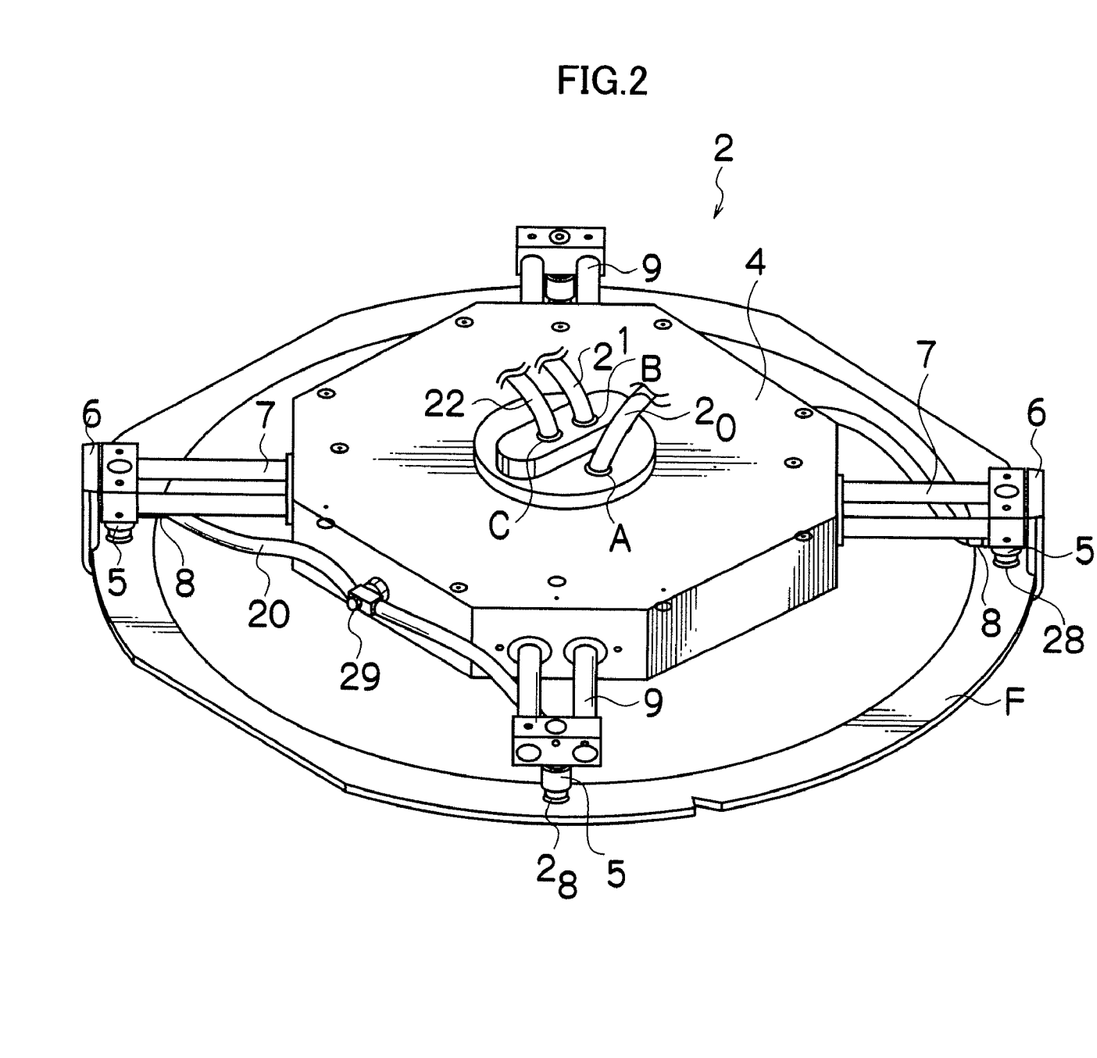
FIG. 2 is a perspective view of a frame holding mechanism.
Figure 3A:
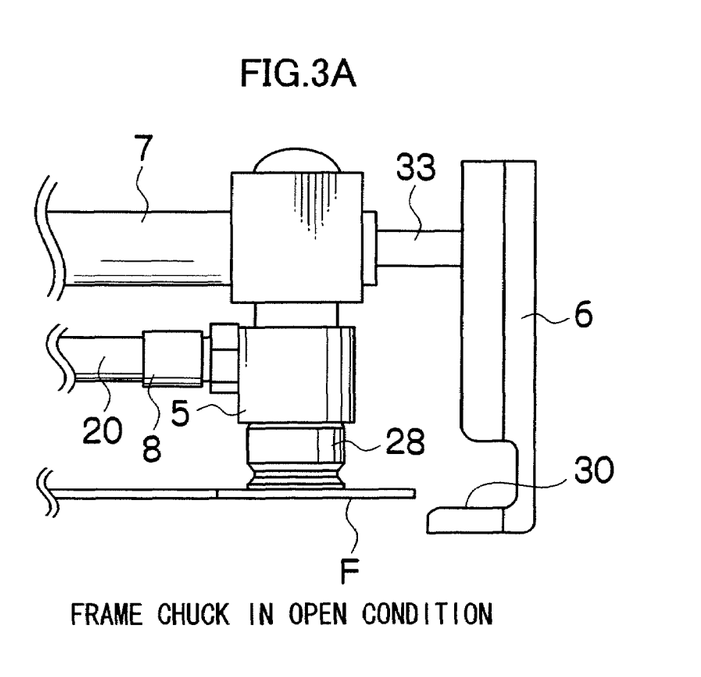
FIGS. 3A and 3B are side views of a frame clamp.
Figure 3B:
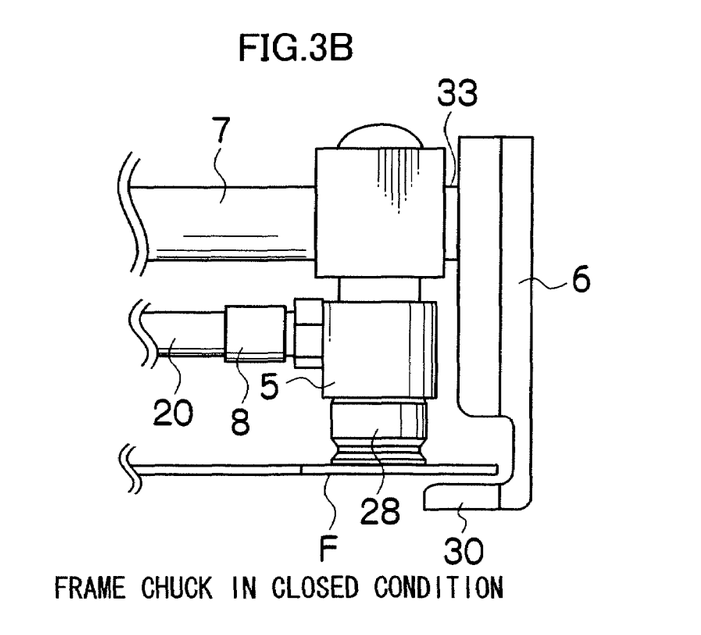

Next, a description will be given of the construction of a work transfer device related to the present invention. FIG. 2 is a perspective view of a frame holding mechanism from which a cover is detached, FIGS. 3A and 3B are side views of a frame clamp, and FIG. 4 is a piping system diagram of a frame holding mechanism.

In the frame holding mechanism 2, arms 9, 9 and cylinders 7, 7 are provided in a holding mechanism main-body 4 in four directions, and an adsorption part 5, which is provided with a pad 28 near the leading end thereof, is attached. A connector 8 is provided on a side surface of the adsorption part 5, and the connector 8 and a T-connector 29 attached to the holding mechanism main-body 4 are connected by a tube for suction air 20.

Figure 4:
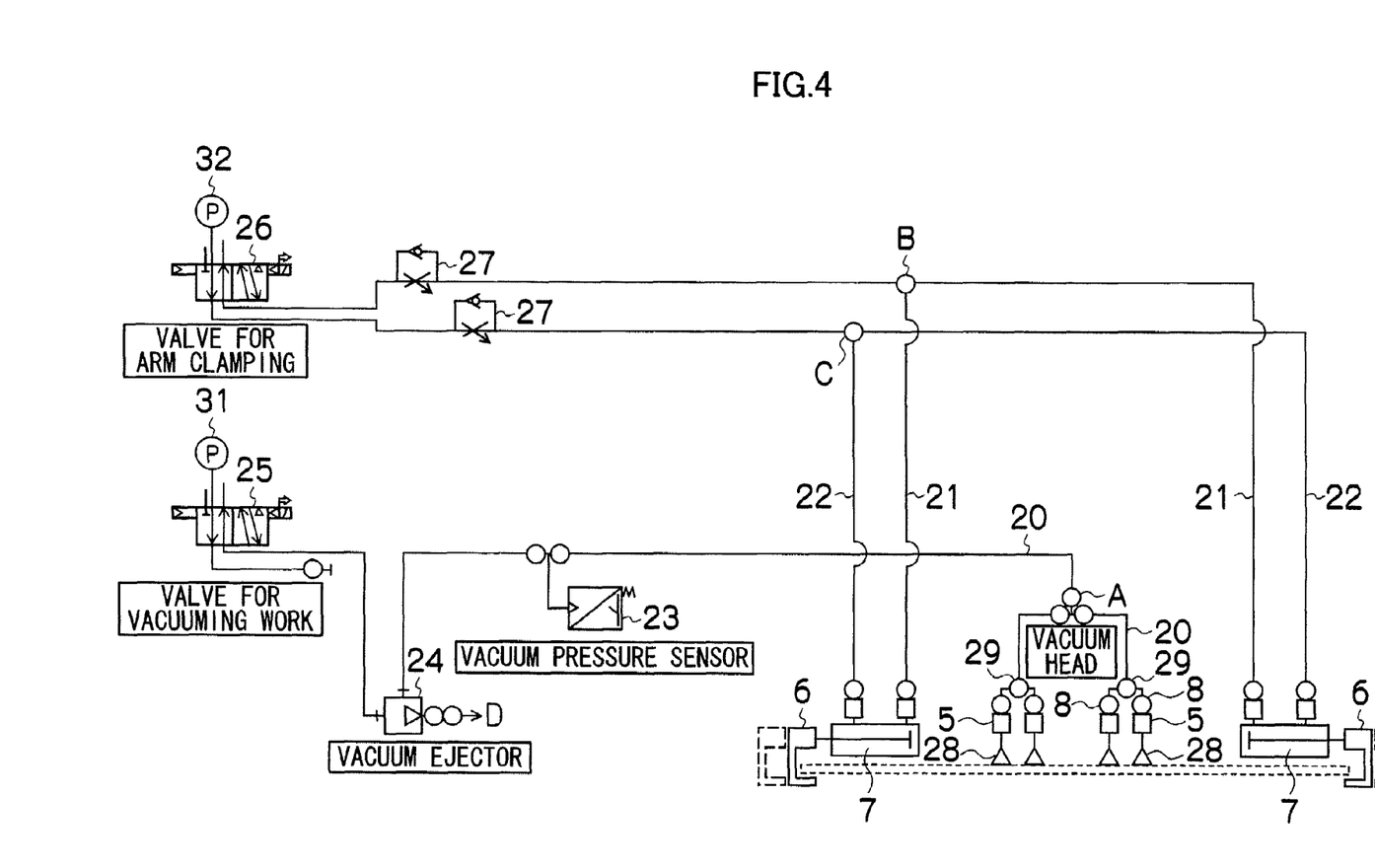
FIG. 4 is a piping system diagram of a frame holding mechanism.

As shown in FIG. 4, the T-connector 29 is connected to an ejector 24 via a piping route which continues to a port A provided within the holding mechanism main-body 4 and the tube for suction air 20. An ejector 24 is connected to a valve 25, and when the valve 25 operates, the air flows from a pump 31 in the arrowed direction D and the air within the pad 28 is discharged.

As a result of this, the adsorption part 5 sucks and adsorbs the frame F by using the pad 28. A pressure sensor 23 is provided in the piping between the adsorption part 5 and the ejector 24, and this pressure sensor 23 detects values of vacuum pressure in the pad 28 and judges whether the frame F is adsorbed at an appropriate vacuum pressure or the frame F has been released from the adsorption.

A frame clamp 6 is provided at the leading end of the cylinder 7. To the cylinder 7 are connected an air tube for elongation 21 connected to a port B and an air tube for contraction 22 connected to a port C. As shown in FIG. 4, the air tube for elongation 21 and the air tube for contraction 22 are connected to a valve 26 respectively via a speed controller 27, and the air from a pump 32 is supplied to either of the air tubes by a changeover of the valve 26.

The cylinder 7 is constructed in such a manner that when air is supplied from the air tube for contraction 22 connected to the port C, a cylinder shaft 33 contracts as shown in FIG. 3B and moves a claw 30 formed in the lower part of the frame clamp 6 to near the bottom surface of the frame F which has been adsorbed by the adsorption part 5.

Also, the cylinder 7 is constructed in such a manner that when air is supplied from the air tube for elongation 21 connected to the port B, the cylinder shaft 33 elongates as shown in FIG. 3A and causes the claw 30 to retract from near the bottom surface of the frame F.

Because a double-acting cylinder is used as the cylinder 7, the cylinder shaft 33 does not move until the air as a driving source is supplied.

As a result of this, in transferring the work W by causing the adsorption part 5 to adsorb the frame F, the claw 30 formed in the frame clamp 6 is placed in a standby condition near the bottom surface of the frame F. Therefore, even when the frame F comes off from the adsorption part 5 because of a power failure or due to defects in parts, the frame F is received by the claw 30. Furthermore, because the frame clamp 6 does not come into contact with the frame F and is present in a position retracted from the frame F before and after transfer, the frame clamp 6 does not hinder the transfer of the frame F and does not interfere with the frame F, either, during the detaching and attaching thereof.

Figure 5:
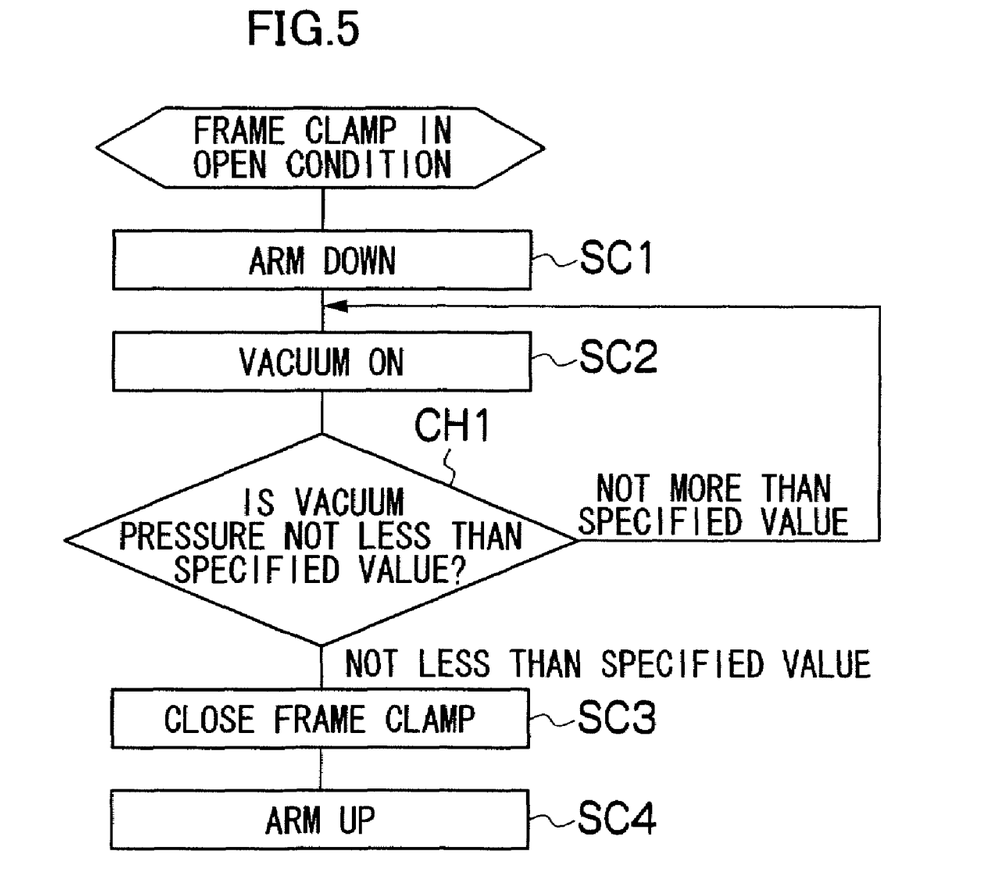
FIG. 5 is a flowchart which shows how a frame clamp is closed.
Figure 6:
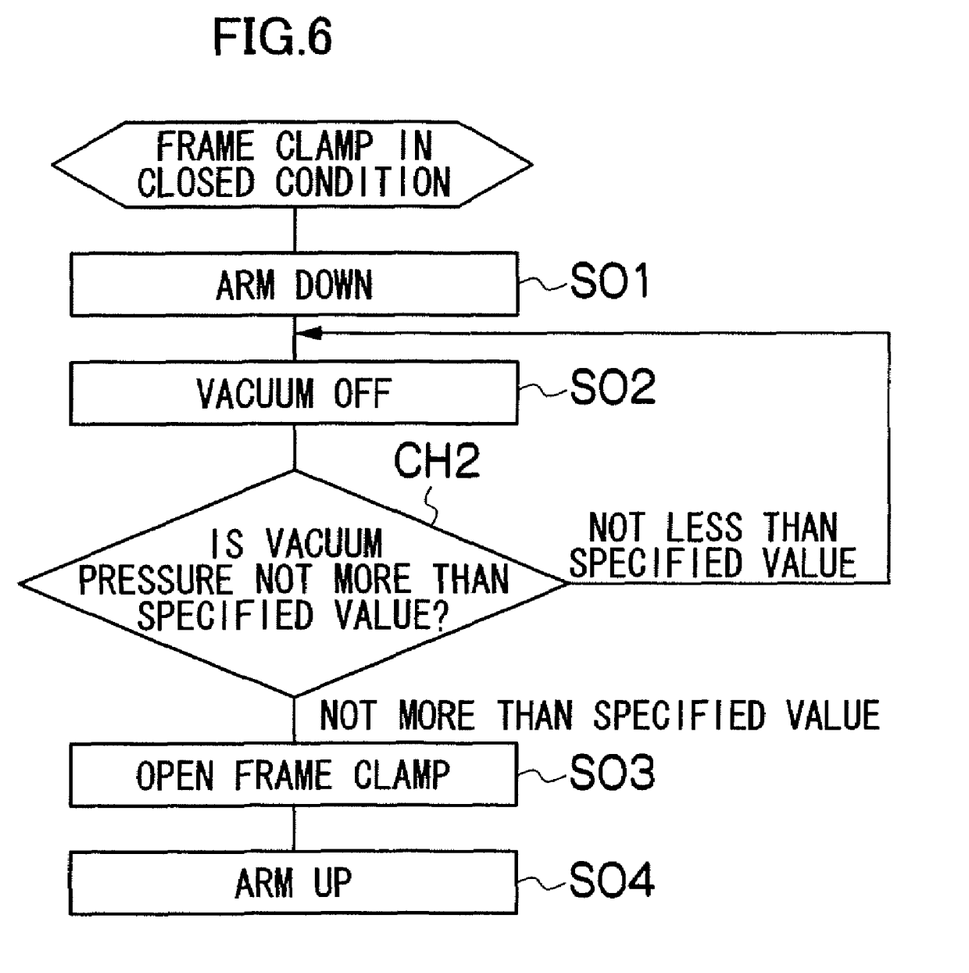
FIG. 6 is a flowchart which shows how a frame clamp is opened.

Next, a description will be given of a method of transferring work related to the present invention. FIG. 5 is a flowchart which shows how a frame clamp is closed. FIG. 6 is a flowchart which shows how a frame clamp is opened.

First, a description will be given of a flow from the adsorption of the frame F to the start of the transfer thereof. In performing the transfer of work W, the flow of operation starts, with the frame clamp 6 in an open condition, which is shown in FIG. 3A.

The frame holding mechanism 2 moves to above the work and the pad 28 of the adsorption part 5 descends to a position in which the pad 28 comes into contact with the frame F (Step SC1).

When the pad 28 comes into contact with the frame F, the valve 25 works and air is supplied from the pump 31 to the ejector 24. As a result of this, the air in the pad 28 is discharged from the ejector 24, the interior of the pad 28 comes to a vacuum condition, and the frame F is adsorbed (Step SC2).

When the adsorption of the frame F is started, a value of vacuum pressure in the pad is detected by the pressure sensor 23 and a judgment is passed on whether the detected vacuum pressure value is not less than a vacuum pressure value which is set in the pressure sensor 23 (Judgment CH1).

In a case where the detected vacuum pressure value is not less than the prescribed vacuum pressure value, the flow of operation shifts to an operation of closing the frame clamp 6. In a case where the detected vacuum pressure value is not more than the prescribed value, the flow of operation returns to before Step SC2 and the operation of adsorbing the frame F is performed again. In a case where a vacuum pressure value does not become more than the prescribed value even when the adsorption operation of the frame is repeated several times, an error signal is emitted and the dicing machine 10 is stopped.

In the operation of closing the frame clamp 6, the valve 26 is actuated and the air is sent to the cylinder 7 from the pump 32 via the air tube for contraction 22. As a result of this, the cylinder shaft 33 contracts and causes the claw 30 formed in the lower portion of the frame clamp 6 to move to near the bottom surface of the frame F adsorbed by the adsorption part 5 (Step SC3).

After the movement of the frame clamp 6, the frame holding mechanism 2 ascends and the transfer of the work W is started (Step SC4).

Next, a description will be given of the flow from the placement of the work W at a target position and the release of the frame F from the adsorption until the transfer is finished.

When the frame holding mechanism 2 on which the frame is adsorbed moves to above a position where the work W is to be placed, the frame holding mechanism 2 descends and places the work W at a placement position (Step SO1).

After the placement of the work W, the valve 25 is actuated and the supply of the air to the ejector 24 is stopped. As a result of this, the frame F is released from the adsorption (Step SO2).

At this time, a value of vacuum pressure in the pad is detected by the pressure sensor 23 and a judgment is passed on whether the detected vacuum pressure value is not more than a vacuum pressure value which is set in the pressure sensor 23 (Judgment CH2).

In a case where the detected vacuum pressure value is not more than the prescribed vacuum pressure value, the flow of operation shifts to an operation of opening the frame clamp 6. In a case where the detected vacuum pressure value is not less than the prescribed value, the flow of operation returns to before Step SO2 and the operation of releasing the frame F from the adsorption is performed again. In a case where a vacuum pressure value does not become less than the prescribed value even when the operation of releasing the frame F from the adsorption is repeated several times, an error signal is emitted and the dicing machine 10 is stopped.

In the operation of opening the frame clamp 6, the valve 26 is actuated and air is sent to the cylinder 7 from the pump 32 via the air tube for elongation 21. As a result of this, the cylinder shaft 33 elongates and causes the claw 30 to retract from near the bottom surface of the frame F (Step SO3).

After the movement of the frame clamp 6, the frame holding mechanism 2 ascends and the transfer of the work W is finished (Step SO4).

As described above, according to a work transfer device and a method of transferring work related to the present invention, even when it becomes impossible to adsorb the frame during the transfer of work because of a power failure and due to defects in valves and the like and the work falls, the frame which is relieved from the adsorption is received by the frame clamp present in the lower portion of the frame and it becomes possible to safely perform the transfer of the work.

Furthermore, the frame clamp is present near the lower portion of the frame, does not come into contact with the frame during transfer, and does not impede the adsorption of the frame by the adsorption part, either.

Incidentally, in this embodiment, the description has been given of a case where the work transfer device is mounted on a dicing machine. However, the present invention is not limited to this and can be advantageously used in a transfer device which is moved between a bonding machine and other devices and the like.

Air is used as a driving source of the cylinder which moves the frame clamp. However, the present invention is not limited to this and can be advantageously used in a cylinder which works by electric power and the like.

Furthermore, although in this embodiment the frame clamp 6 is attached only in two places, the present invention is not limited to this. The present invention can be advantageously used also in a case where the frame clamp 6 is attached in two places or more and a set of frame clamps 6 is provided at least on a diagonal line.

What is claimed is:

1. A work transfer device, comprising:
    a vacuum holding mechanism for holding a frame on which work is mounted, said holding mechanisms having a plurality of arms with vacuum pickups at an end area of each arm;
    sensor means for detecting a vacuum pressure value in the vacuum pickups; and
    a plurality of frame clamps and clamp actuators for moving the clamps between a extended position near a bottom surface of the frame when the frame is held by the vacuum pickups and a retracted position away from the bottom surface of the frame when the frame is released from the vacuum pickups;
    wherein each of the frame clamps is mounted to a respective one of the vacuum pickups, and
    wherein the clamp actuators are operative for moving the clamps into their extended position in response to the sensor means detecting a vacuum pressure value in the vacuum pickups above a predetermined value indicative of the frame being securely held and are operative for moving the clamps into their release position in response to the sensor means detecting a vacuum pressure value in the vacuum pickups below a prescribed value indicative of the frame having been released by the vacuum pickups.

2. Method of transferring a frame on which work is mounted using a vacuum holding mechanism having a plurality of arms with vacuum pickups at an end area of each arm, sensor means for detecting a vacuum pressure value in the vacuum pickups; and a plurality of frame clamps and clamp actuators for moving the clamps between a extended position near a bottom surface of the frame when the frame is held by the vacuum pickups and a retracted position away from the bottom surface of the frame when the frame is released from the vacuum pickups, comprising the steps of:
    applying a vacuum to the vacuum pickups to adhere the frame to the vacuum pickups;
    moving the clamps into their extended position in response to the sensor means detecting a vacuum pressure value in the vacuum pickups above a predetermined value indicative of the frame being securely held;
    transferring the frame holding the work to a desired location;
    releasing the applied vacuum so as to disengage the frame from the vacuum pickups; and
    moving the clamps into their release position in response to the sensor means detecting a vacuum pressure value in the vacuum pickups below a prescribed value indicative of the frame having been released by the vacuum pickups.

* * * * *